Figure 1:
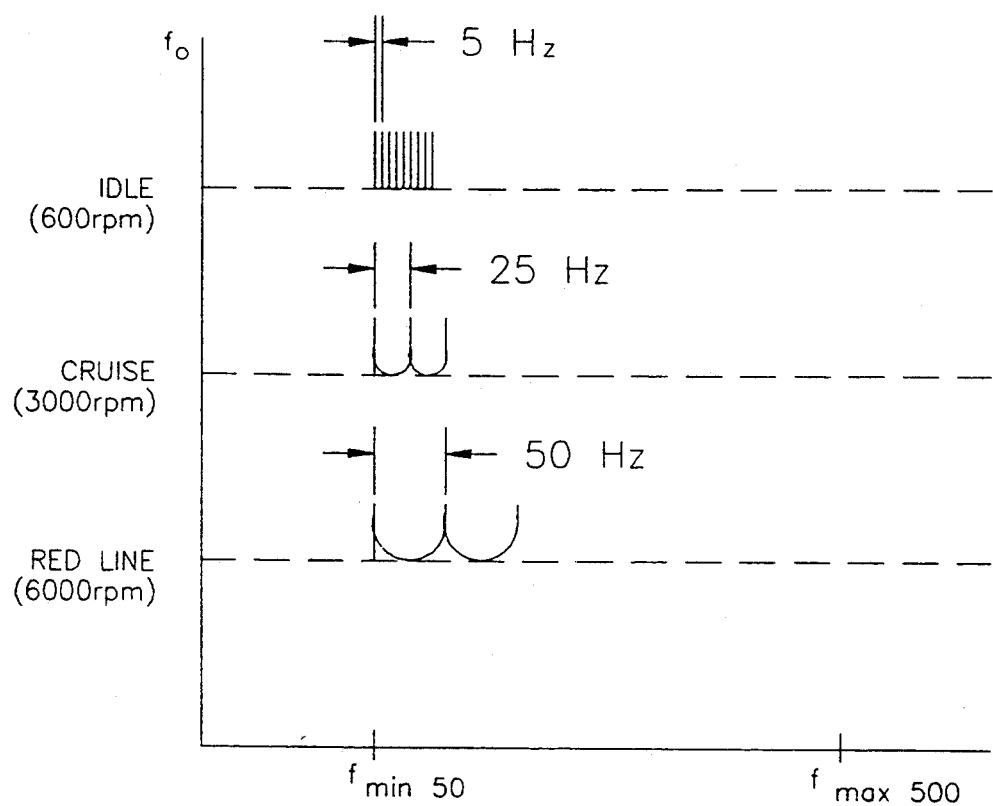

United States Patent

Denenberg et al.

[11] Patent Number: 5,311,453
[45] Date of Patent: May 10, 1994

[54] VARIABLE POINT SAMPLING

[75] Inventors: Jeffrey N. Denenberg, Trumbell, Conn.; Roy H. Scott, Columbia, Md.

[73] Assignee: Noise Cancellation Technologies, Inc., Linthicum, Md.

[21] Appl. No.: 943,629

[22] Filed: Sep. 11, 1992

[51] Int. Cl.⁵ .................................. H04B 15/00
[52] U.S. Cl. ........................................ 364/574
[58] Field of Search .................. 364/574; 375/106

[56] References Cited

U.S. PATENT DOCUMENTS

| | | |
|---|---|---|
| 4,153,815 | 5/1979 | Chaplin et al. |
| 4,336,593 | 6/1982 | Takase ............................ 364/574 |
| 4,417,098 | 11/1983 | Chaplin et al. |
| 4,490,841 | 12/1984 | Chaplin et al. |
| 4,639,885 | 1/1987 | Spock et al. ...................... 364/574 |
| 4,878,188 | 10/1989 | Ziegler, Jr. |
| 4,947,356 | 8/1990 | Elliott et al. ...................... 364/574 |
| 5,007,007 | 4/1991 | van Zanten et al. ............... 364/574 |
| 5,029,118 | 7/1991 | Nakajima et al. ................. 364/574 |
| 5,119,321 | 6/1992 | Burton, Jr. et al. ............... 364/574 |
| 5,157,596 | 10/1992 | Alcone ............................. 364/574 |

*Primary Examiner*—Jack B. Harvey
*Assistant Examiner*—Thomas Peeso
*Attorney, Agent, or Firm*—J. W. Hiney

[57] ABSTRACT

A method and system by which the number of samples used to characterize the noise cycle of an active noise cancellation system varies dynamically as a function of the fundamental operating frequency of the system.

4 Claims, 2 Drawing Sheets

| Column 1 | 2 | 3 | 4 | 5 | 6 | 7 |
|---|---|---|---|---|---|---|
| RPM | f0 | No. of harmonics to cancel $f_{hi}=500Hz$ | No. of points per noise cycle | Max. no. of harmonics | Sample rate | Condition |
| A  600 (Idle) | 5 | 100 | 64 | 32 | 640 | too slow; not enough harmonics |
| B  | | | 128 | 64 | 1280 | too slow; not enough harmonics |
| C  | | | 256 | 128 | 2560 | OK |
| D  3000 (Cruise) | 10 | 50 | 64 | 32 | 1280 | too slow; not enough harmonics |
| E  | | | 128 | 64 | 2560 | OK |
| F  | | | 256 | 128 | 5120 | too fast; not enough processor throughput |
| G  6000 (Red Line) | 25 | 20 | 64 | 32 | 3200 | OK |
| H  | | | 128 | 64 | 6400 | too fast; not enough processor throughput |
| I  | | | 256 | 128 | 12800 | too fast; not enough processor throughput |

Figure 2

VARIABLE POINT SAMPLING

Synchronous active noise cancellation systems have been shown to be effective when a good source of sync is available and the fundamental noise cycle period does not vary over too large a dynamic range. The present invention extends the practical application of synchronous active noise cancellation to situations where the fundamental noise cycle varies over a range of three or more decades with little or no compromise in system performance.

The objective is to extend the practical application of synchronous active noise cancellation to situations where the fundamental noise cycle varies over a range of three or more decades with little or no compromise in system performance.

Synchronous active noise cancellation systems have been described earlier. The first such systems (Chaplin U.S. Pat. Nos. 4,153,815; 4,417,098) teach the use of a synchronizing signal which minimizes computational effort while maximizing results by focusing on only those frequency components in the noise due to the offending source. Later efforts (Chaplin U.S. Pat. No. 4,490,841; Ziegler U.S. Pat. No. 4,878,188) further teach that the use of Digital Signal Processing (DSP) techniques improve these systems.

Efforts to subsequently apply these techniques to the cancellation of exhaust noise from automobile engines have further shown the effectiveness of the synchronous approach in handling a noise source which varies in speed over a 10:1 range. The Fundamental Noise Cycle of such a source, defined as the lowest frequency component in the noise when the source runs at constant speed, is directly related to the engine speed. All of the frequency components in the noise are then harmonics of, or multiples of the frequency of, this fundamental noise cycle.

A serious limitation which remains in the prior art, however, is the computational expense of both maintaining a high enough sample rate at low engine speeds (600 RPM) so that the anti-aliasing and reconstruction filters can be effective while not requiring excessive computational resources at high engine speeds (6000 RPM) to keep up with the data rate.

One factor which helps to control the computational effort as engine speeds rise in these systems is that the active noise cancellation system need only operate over a fixed frequency range. Therefore as the fundamental frequency rises, the number of harmonics in the noise to be canceled decreases lowering the computational effort per sample as the sample rate increases.

This allows the practical operation of these synchronous systems over a 10:1 range of engine speed with only some compromise in system performance at each extreme of the operating range.

DESCRIPTION OF THE INVENTION

The prior art as described in Ziegler U.S. Pat. No. 4,878,188 uses Sine/Cosine tables, a sampling rate which is a fixed multiple (the Number of Points) of the fundamental noise cycle frequency ($f_{nc}$), and Discrete Fourier Transforms (DFT) to concentrate on only those components in the residual signal due to the noise source. Since the processing is specifically done for each harmonic of $f_{nc}$, parameters can be set to control the processing load of the CPU. These are:

$f_{lo}$: The lowest frequency to be processed. The system checks the actual frequency of the component by multiplying its harmonic number by a measurement of the fundamental noise cycle frequency. If the harmonic is below $f_{lo}$, it is not processed.

$f_{hi}$: The highest frequency to be processed. The system checks the actual frequency of the component by multiplying its harmonic number by $f_{nc}$. If the harmonic is above $f_{hi}$, it is not processed.

K: The maximum number of harmonics to be processed. The system keeps track of the number of harmonics being processed and does not process more than the first K starting at $f_{lo}$. If $f_{max}=(K-1)*f_{nc}$ is less than $f_{hi}$, then it determines the highest frequency processed.

In the present invention, the number of sample points per fundamental noise cycle ($N_s$) is not a constant. It is varied to hold the sample rate within a narrow range (e.g. between 2 kHz and 4 kHz). The effect of varying $N_s$ is best explained by re-examining the Nyquist Theory.

The Nyquist Theory states that time samples of a frequency limited waveform are a full description when the sample rate is greater than twice the highest frequency in that waveform. In the real world signals are neither band limited nor available for long time averages, so the sample rate must be faster than two times the highest frequency for good performance. Experience has shown that a sampling rate of 4 to 6 times the highest operating frequency ($f_{hi}$) works well. The highest frequency in the signal is controlled by the use of band-limiting filters before the Analog/Digital (A/D) converters (usually referred to as anti-aliasing filters) and additional band-limiting filters after the Digital/Analog (D/A) converters (usually referred to as reconstruction filters).

If we assume (for ease of description only) that $N_s$ is a power 2 and as the noise source speeds up becomes more than a factor of two higher than required for good performance we have the following condition:

$$((N_s/6)-1)*f_{nc} >> 2*f_{hi}$$

If the sample rate is then suddenly dropped to $N_s/2$, there will be no direct effect on the operation of the system. All of the impacted frequency components are above $f_{hi}$ and are not processed either before or after the change in sampling rate. There are some system gain factors and threshold constants that are a function of the sampling rate, but they can be easily adjusted at the time of the transition.

Similarly as the noise source slows down the sample rate can be increased by a factor of two before $((N_s/6)-1)*f_{nc}$ drops below $f_{hi}$.

By this approach the Input/Output (I/O) costs and overhead are set to be somewhat more than that required for the slowest $f_{nc}$ expected in the application and maintained at less than twice this cost and overhead for all faster speeds.

Accordingly it is an object of this invention to apply synchronous active noise cancellation where the fundamental noise cycle varies over a range of 3 or more decades with little or no compromise in system performance.

Another object of this invention is to vary the number of sample points per fundamental noise cycle.

These and other objects of the invention will become apparent when reference is had to the accompanying description and drawings in which FIG. 1 shows a plot of $f_{nc}$ versus frequencies (harmonics) in the band of interest for different engine speeds.

FIG. 2 is a chart of the range of sampling rates for varying the number of sampling points in engine application.

Referring to FIG. 1 there are shown plots for 600 (IDLE), 3000 (CRUISE) and 6000 RPM (RED LINE). In the IDLE condition there is a harmonic component every 5 Hz, in CRUISE every 25 Hz, and at RED LINE every 50 Hz. The number of harmonics changes over the RPM range as shown in the table of FIG. 2. This modification allows the algorithms used to successfully cancel noise in protocols with as low as a 1 Hz noise cycle to as rapid as a 200 Hz noise cycle.

Referring to FIG. 1, there are spectral plots showing the harmonic components of the noise for a system operating at three different speeds. The descriptive terms IDLE, CRUISE and RED LINE have been applied to allow the reader to analogize the plots to automotive applications. In the IDLE condition, a harmonic component exists at every 5 Hz interval. Likewise, in the CRUISE condition there is a harmonic component every 25 Hz, and in the RED LINE condition every 50 Hz. If we apply the constraints that $f_{lo}$ and $f_{hi}$ are 50 Hz and 500 Hz respectively, we can see that the number of harmonics in this band of interest changes as the RPM changes. This will be discussed further in the context of FIG. 2. The fundamental frequency in FIG. 1, $f_{nc}$, is the frequency of 2 rotations of a 4-cycle engine, e.g. a V-8. This can easily be determined from the calculation:

$$f_{nc} = (RPM/60)/2$$

The $f_{lo}$ and $f_{hi}$ parameters are static; they do not change as the engine speed changes. These 2 parameters define the frequency range, or band of interest, in which the system operates. One can easily see that as the RPM increases, the number of harmonics in the band of interest decreases, thus the resolution of the DFT required for optimum performance could vary without affecting the system performance. This is one objective of this invention. This provides a significant improvement for systems that use this method, since several hundred harmonics can be canceled at very low speeds, while at higher speeds the algorithm works just as effectively. One example of this, the NCT MRI (magnetic resonance imaging) system, consists of a headset, especially constructed non-metal (pneumatic) tubing for carrying the anti-noise, and an NCT Model 2000 controller. The MRI process employs several different protocols, or modes of operation. These protocols can vary in range from a fundamental operating frequency of 1 Hz and 400-500 harmonics at the low end, to 200 Hz and 2 harmonics at the high end. The NCT 2000 controller, which uses a proprietary Fast Fourier Transform (FFT) algorithm, can handle this entire range of system operation with no tuning of the algorithm necessary by simply adding the Variable Number of Points mechanism.

FIG. 2 compares and contrasts in tabular form the three different conditions portrayed in FIG. 1. Based on the RPM, the fundamental frequency of the system can be determined by dividing the RPM by 60 sec/min which gives revolutions per second. Since there are 2 revolutions per noise cycle in this example of a 4 cycle engine, dividing the revolutions per second by 2 yields the fundamental frequency. This is shown in column 2. From the fundamental, the number of harmonics to cancel $f_{hi}$ (which we are arbitrarily setting to 500 Hz) can be determined by dividing $f_{hi}$ by the fundamental frequency. This figure is shown in column 3. We next consider, in column 4, the number of points we will use to define the noise cycle. The numbers 64, 128, and 256 have been chosen since numbers that are powers of 2 simplify some of the calculations. As was stated earlier in the discussion of the Nyquist Theory, the sample rate should generally be twice the highest frequency in the waveform. From this we can deduce the following: given the number of points chosen to define the noise cycle, the maximum number of harmonics that can theoretically be canceled is determined by dividing the number of points by 2. This is shown in column 5. Finally, the sample rate is defined as the number of points per noise cycle multiplied by the fundamental frequency, as shown in column 6.

Analysis of the information in FIG. 2 reveals two conditions which would prevent the system from working. The first condition occurs when the number of points chosen to represent the noise cycle does not allow for an adequate number of harmonics to be canceled (following the Nyquist Theory). This can be seen in rows A, B, and D. Using row A as an example, we see that 64 points define the noise cycle. By Nyquist, we can process up to 32 harmonics with 64 points. At IDLE we need to be able to process 100 harmonics to cancel up to $f_{hi}$ which has been set to 500 Hz. Thus, we need a greater number of points to define the noise cycle. For the IDLE example, if we choose 256 points, then 128 harmonics can be processed and our sample rate falls within the optimum range of 2 kHz to 4 kHz.

The second condition that could prevent the system from operating occurs when the sample rate rises above the optimum range. This is shown in Rows F, H, and I. In this state, the inadequate throughput of the processor prevents all of the necessary information from being processed in the short amount of time between samples. Here, the solution is to drop to a lower number of points. By way of example, a system operating with a fixed number of points per noise cycle (as in the prior art), would not be able to function over the entire range depicted in FIG. 2. If 256 points were chosen, this would be acceptable at IDLE, but would not work well at CRUISE or RED LINE. Similarly, 64 or 128 points could be chosen, but these would present limitations as well. Implementation of the current invention would solve one problem. At IDLE, the algorithm should be run with 256 points defining the noise cycle. As the system accelerates, and the condition:

$$((N_s/6)-1)*f_{nc} >> 2*f_{hi}$$

is met, the number of points is dropped by $\frac{1}{2}$ to 128 without affecting the quality or the nature of the cancellation. As the system accelerates further into the RED LINE area, the number of points are dropped again by $\frac{1}{2}$ to 64 points.

From FIG. 2, we conclude that varying the number of points per noise cycle significantly extends the operating range of the noise cancellation controller without affecting the performance of the system.

The physical limitations are that one must cut the system off below 50 Hz as the required speaker would be impractically large. Above 500 Hz it also has to be cut off as the wave lengths of the noise are too short but again noise above 500 Hz is easily handled by passive means. In order to accomplish the invention the noise is sampled at various points and the sample rate is a multiple of the noise cycle.

Having described the preferred embodiment of the invention, attention is directed to the following claims. It will be obvious to those of ordinary skill in the art that changes and modifications can be made to this invention without departing from the scope and spirit of the claims.

We claim:

1. In a digital, synchronous, noise cancellation system for canceling the frequency components, the method of maintaining the sampling rate and required processing resources within a small range while the fundamental noise cycle varies over a large range, said method comprising
    determining the highest frequency to be processed,
    determining the current noise cycle rate,
    changing the number of sample points per noise cycle dependent upon the noise cycle rate and the highest frequency to be processed.

2. A method as in claim 1, said method additionally including
    checking the actual frequency of the component by multiplying its harmonic number by a measurement of the current fundamental noise cycle frequency so that if the harmonic is above the highest frequency, that harmonic is not processed.

3. A method as in claim 2, said method wherein the number of sample points used to define the noise cycle of the algorithm varies based on the fundamental operating frequency of the system and the constraints placed on it by $f_{hi}$ and $f_{lo}$ parameters.

4. The method of claim 3 where the variation of the number of points used to represent the noise cycle is determined by halving the number whenever the condition $$((N_s/k)-1)*f_{nc} > 2*f_{hi}$$

is met, where
   $N_s$ is the number of points in the noise cycle
   $f_{nc}$ is the current fundamental frequency of the noise
   $f_{hi}$ is a predetermined high frequency cutoff
   k is a constant greater than 2 to satisfy the Nyquist criteria or, inversely, doubling the number of points whenever $$((N_s/k)+1)*f_{nc} < 2*f_{hi}.$$

* * * * *